United States Patent [19]
Jaso et al.

[11] Patent Number: 6,093,631
[45] Date of Patent: Jul. 25, 2000

[54] DUMMY PATTERNS FOR ALUMINUM CHEMICAL POLISHING (CMP)

[75] Inventors: Mark A. Jaso, Manassas, Va.; Rainer F. Schnabel, Wappingers Falls, N.Y.

[73] Assignee: International Business Machines Corporation, Armonk, N.Y.

[21] Appl. No.: 09/007,911

[22] Filed: Jan. 15, 1998

[51] Int. Cl.[7] .............................................. H01L 21/4763
[52] U.S. Cl. ...................... 438/618; 438/633; 438/692; 438/926
[58] Field of Search .................................. 438/618, 633, 438/692, 926

[56] References Cited

U.S. PATENT DOCUMENTS

| | | |
|---|---|---|
| 4,003,772 | 1/1977 | Hanazono et al. . |
| 4,491,500 | 1/1985 | Michaud et al. . |
| 4,770,740 | 9/1988 | Tsuzuki et al. . |
| 5,043,294 | 8/1991 | Willer et al. . |
| 5,081,796 | 1/1992 | Schultz . |
| 5,278,105 | 1/1994 | Eden et al. . |
| 5,423,716 | 6/1995 | Strasbaugh . |
| 5,529,953 | 6/1996 | Shoda . |
| 5,549,212 | 8/1996 | Kanoh et al. . |
| 5,602,423 | 2/1997 | Jain ........................................ 257/752 |
| 5,899,706 | 5/1999 | Kluwe et al. . |
| 5,923,563 | 7/1999 | Lavin et al. ............................. 364/488 |
| 5,948,573 | 9/1999 | Takahashi ................................... 430/5 |

FOREIGN PATENT DOCUMENTS

| | | |
|---|---|---|
| 8-222632 | 8/1996 | Japan . |
| 09181159 | 7/1997 | Japan . |
| 10321625 | 12/1998 | Japan . |
| WO96/27206 | 9/1996 | WIPO . |

OTHER PUBLICATIONS

MRS Bulletin, "Copper–Based Metallization in ULSI Structures", Aug. 1994, pp. 15–18.

*Primary Examiner*—Caridad Everhart
*Attorney, Agent, or Firm*—DeLio & Peterson LLC; John J. Tomaszewski

[57] ABSTRACT

A method and apparatus is provided for planarizing damascene metallic circuit patterns of a plurality of discrete integrated circuit chips on a metal coated silicon wafer wherein the circuitry on the chips on the wafer are either designed to be within a defined high metal density circuit range and low density metal circuit range and/or to provide dummy circuitry in the damascene process to provide a substantially uniform circuit density over the chip and the wafer surface. It is preferred that each chip on the surface of the wafer be divided into a plurality of regions and that each region be provided with dummy metallization, if necessary, to provide a relatively uniform circuit density in that region and consequently on the wafer surface. The invention also contemplates adding dummy circuitry to the periphery of the wafer in areas which are not formed into chips (chip fragments). The invention also provides semiconductor wafers made using the method and/or apparatus of the invention.

6 Claims, 4 Drawing Sheets

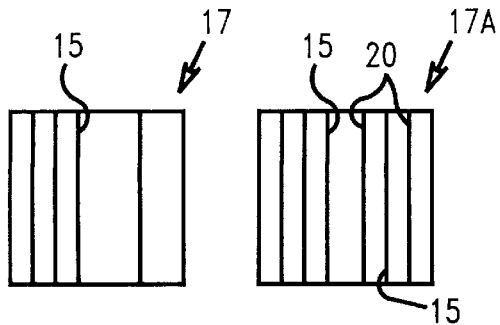
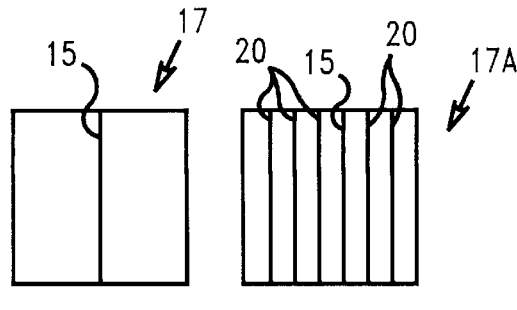
FIG. 3A  FIG. 3B  FIG. 4A  FIG. 4B
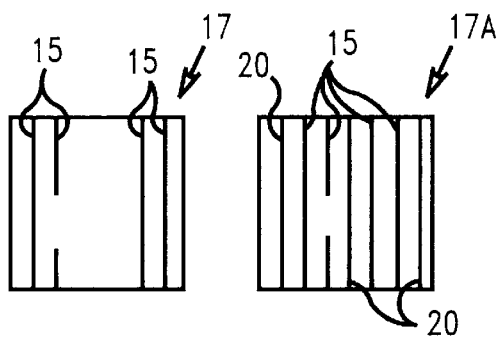
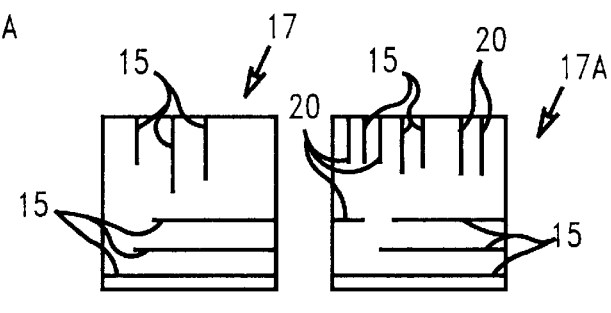
FIG. 5A  FIG. 5B  FIG. 6A  FIG. 6B
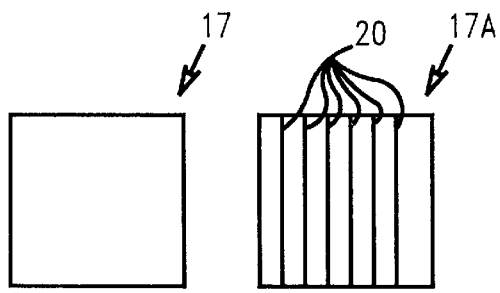
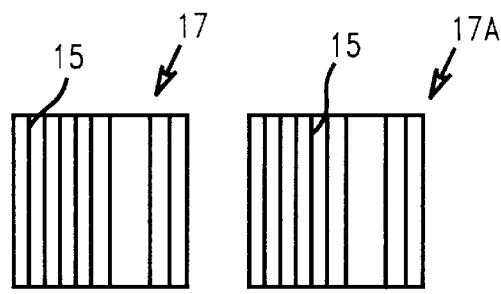
FIG. 7A  FIG. 7B  FIG. 8A  FIG. 8B
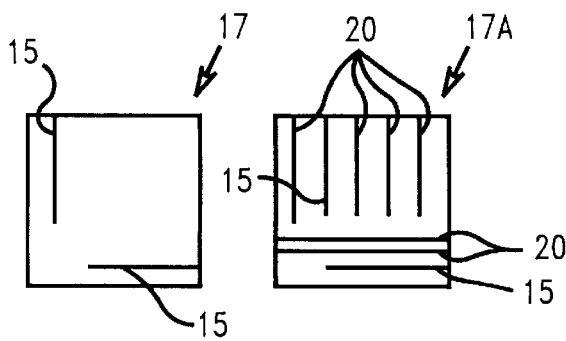
FIG. 9A  FIG. 9B

DUMMY PATTERNS FOR ALUMINUM CHEMICAL POLISHING (CMP)

BACKGROUND OF THE INVENTION

1. Field of the Invention

The present invention relates to a system and method for polishing semiconductor wafers and, more particularly, to the polishing of damascene formed interconnects on the wafer using the chemical-mechanical polishing process in order to achieve a high degree of damascene planarity.

2. Description of Related Art

In the fabrication of integrated circuit devices, numerous integrated circuits are typically constructed simultaneously on a single semiconductor wafer. The wafer is then later divided by cutting the wafer into the individual integrated circuit devices.

Typically, the integrated circuit device is made by a series of layering processes in which metallization, dielectrics, and other materials are applied to the surface of the wafer to form a layered interconnected structure. One important step in the fabrication process is to form interconnects in the insulator layers. The interconnects connect different layers of the integrated circuit device together and provides an integrated circuit device having high complexity and circuit density.

One method for forming the interconnects is to use a damascene method wherein, in general, a via or trench pattern is etched into a planar dielectric layer and then the pattern is filled by metal. Excess metal is typically applied and covers the upper surface of dielectric. The excess metal is then polished away to the patterned metal surface. As with other steps in the fabrication process, it is of extreme importance that the polished interconnect damascene layer be planar.

In order to achieve the degree of planarity required to produce ultra high density integrated circuits, chemical-mechanical planarization processes are now typically employed in the industry. In general, the chemical-mechanical planarization (CMP) process involves pressing a semiconductor wafer against a moving polishing surface that is wetted with a chemically reactive, abrasive slurry. Slurries are usually either basic, acidic or neutral and generally contain alumina or silica particles. The polishing surfaces typically are a planar pad made of a relatively soft, porous material such as blown polyurethane. The pad is usually mounted on a planar platen.

In the CMP process, the wafer is typically secured to a carrier plate by vacuum or by a mounting medium such as an adhesive with the wafer having a force load applied thereto through the carrier by a pressure plate so as to press the wafer into frictional contact with the polishing pad mounted on a rotating turntable. The carrier and pressure plate also rotate as a result of either the driving friction from the turntable or rotational drive means directly attached to the pressure plate. In a typical polishing machine, the wafer is transported across the polishing surface to polish the wafer. The CMP process is well known and U.S. Pat. No. 5,423,716 is exemplary and the disclosure of the patent is hereby incorporated by reference.

With regard to the semiconductor devices formed from the wafer, the devices typically include a plurality of inter-layered circuits such as metal lines forming an integrated circuit which are interconnected by vias or interconnects between the layers. In the damascene process, metallization of the interconnects is performed by etching the desired circuitry in the dielectric layer down to the active region of the device. A thin layer of conductive metal is deposited by, for example, vacuum evaporation, sputtering or chemical vapor deposition (CVD) techniques, over the entire wafer. The unwanted portions of this metal layer are removed by CMP leaving the thin lines of metals as interconnects.

Both single damascene structures and double damascene layers may be made by the same process and both processes require a CMP process to polish the wafer down to the surface of the interconnects and provide a planar surface. Unfortunately, problems such as dishing occur causing a non-planar surface. The dishing effect is particularly serious since the polishing needs to be carried out until the metal is cleared on the entire wafer, i.e., wherein the metal is left exclusively in previously etched lines without any metal on the surface of the dielectric. It has been found that a significant overpolish is typically needed which results in erosion of dielectric and dishing of metal as much as 100 nm below the level of the dielectric surface. As a consequence, the thickness of the interconnects in overpolished areas is severely reduced resulting in an increased sheet resistance as compared to interconnects in other areas of the wafer and/or the individual integrated circuit device. Additionally, an uneven topography is introduced on the wafer surface after CMP which will be repeated with slight attenuation after subsequent deposition of dielectric layers problems at later steps in the fabrication process.

Bearing in mind the problems and deficiencies of the prior art, it is therefore an object of the present invention to provide a method for polishing semiconductor wafers and other workpieces which have been coated with a layer of metal in a damascene process.

It is an additional object of the invention to provide an apparatus for polishing semiconductor wafers and other workpieces during the damascene step of the fabrication process.

It is another object of the present invention to provide planar workpieces, including semiconductor wafers, made using the improved method and apparatus of the invention.

Other objects and advantages of the present invention will be readily apparent from the following description.

SUMMARY OF THE INVENTION

The above and other objects and advantages, which will be apparent to one of skill in the art, are achieved in the present invention which is directed, in a first aspect, to a method for planarizing damascene metallic circuit patterns of a plurality of discrete integrated circuit chips on a metal coated silicon wafer comprising the steps of:

preferably dividing each chip on the wafer into a plurality of regions;

determining the metal density for each region of each chip based on the circuit pattern for that region;

adding a dummy circuit pattern to each region on each chip to provide at least a minimum metal density in each region or setting a maximum and/or minimum metal density for each region;

forming both the desired circuit pattern and any dummy circuit pattern as openings in a dielectric layer on each chip;

coating the patterned dielectric layer with a layer of metal which metal fills the openings forming the desired circuit pattern and any dummy circuit pattern and covers the surface of the wafer including the circuit patterns; and polishing the metal coated wafer until no metal remains outside the desired and any dummy circuit patterns.

Broadly stated, the invention is directed to providing a uniform distribution of damascene metal line circuitry across each integrated circuit chip. For a typical integrated circuit chip, the pattern factor of metal circuitry on a damascene layer varies up to about 80 or 90% and the pattern factor for a particular area or region may be defined as the area covered by the metal divided by the total area of the particular area or region. Thus, if in a square area bounded by sides of 20 microns by 20 microns, the metal covers an area of 200 square microns, the pattern factor is 50%.

In areas of high pattern factor (HPF), e.g., 60% it has been found that the metal surface, after deposition, is lower than in areas of low pattern factor (LPF) areas, e.g., 20% due to mass conservation during the sputtering or other deposition process. As a consequence, during the CMP process, the metal above the dielectric is removed differently in HPF areas as compared to LPF areas. Since the polishing needs to be carried out until the patterned metal is cleared on the entire wafer leaving metal exclusively in previously etched lines, HPF areas generally experience a significant overpolish resulting in erosion of the dielectric and dishing of metal up to 100 nm below the level of the dielectric surface. As a result, the thickness or height of lines (interconnects) in HPF areas is thinner or shorter resulting in increased sheet resistance as compared to the thicker lines in LPF areas.

To overcome the dishing effect and other nonplanarization, the invention decreases the differences in pattern factors for regions on the chip. For example, for HPF areas of up to 90% as compared to LPF areas of 0% or 20–30%, the difference in pattern factor may be as high as 90%. It is one aspect of the invention to decrease the difference in pattern factor across the chip surface by providing a uniform metal density (pattern factor) across the surface of the chip and, concomitantly, of the wafer.

In another aspect of the invention, a method is provided to set a predetermined high pattern factor design limit of say 60–90%, preferably 70–80%. Using this method, the difference between the high pattern factor areas and the low pattern factor areas is minimized due to the lower upper design limit of the HPF areas.

In a further aspect of the invention, a predetermined low pattern factor design limit is set. For a lower limit of, for example, 20–50%, differences between the high and low pattern factors on the chip are minimized.

In a preferred aspect of the invention, a high pattern factor design limit and a low pattern factor design limit are both defined which will result in increased metal circuitry uniformity across the chip and wafer surface. For example, if the HPF limit is set at a maximum of 70% to 80% and a LPF limit at a minimum of 40% to 50%, the circuit density of the areas will differ by only 20% to 40% across the surface of the chip and wafer and result in a metal surface which has significantly less erosion or dishing after CMP processing.

In another aspect of the invention, the lower pattern factor design limit can be artificially generated for any given region on the chip or wafer surface by using a dummy circuit design. While it is preferred that an upper pattern factor limit also be used, this is not necessary and the use of a dummy circuit pattern layout will minimize the difference in circuit density over the chip and wafer surface and provide for a uniform metal surface after CMP.

Basically, the data defining the metal features on a given damascene level would be inputted into a computer and an algorithm used to generate dummy circuitry to increase the circuitry to at least a lower pattern factor limit for a particular region. While the types and sizes of the circuitry can be chosen in a wide range, it is preferred to generate circuitry features of uncritical size like 1 micron wide lines with 1 micron spacing. More preferred is to mimic the size of the chip circuitry.

It is an important feature of the invention that the dummy lines do not have any electrical contact to features of the chip design. Ideally, the dummy lines are connected through underline (or above line) levels to the substrate to avoid floating capacitances in the neighborhood of current leading wires acting as a parasitic noise and RC delay source.

In a further aspect of the invention, the method of the invention is also directed to the control of the metal density (pattern factor) over the entire wafer. This is important since there are areas at the periphery of the wafer which are not formed into chips because of the curved configuration of the wafer but may still effect the metal uniformity of the wafer and may result in dishing after the CMP process. It is therefore an additional feature of the invention to form partial dummy chips (with metallization) out to the edge of the wafer so that the entire wafer is covered with chips and chip fragments of a more uniform metal pattern factor.

In a further aspect of the invention, an apparatus is provided to make planar damascene wafers. Wafers made using the apparatus and method of the invention are also contemplated herein.

An apparatus for planarizing damascene metallic circuit patterns of a plurality of discrete integrated circuit chips on a metal coated silicon wafer comprises:

a rotatable turntable assembly;

a polishing pad supported on said assembly;

a rotatable carrier located above said assembly and adapted to hold a silicon wafer during planarizing and positioned between said carrier and said polishing pad; and means for changing the pattern factor (metal density) of metal across the surface of the wafer (preferably region by region) by either setting a high metal density pattern factor design limit and/or a low metal density pattern factor design limit or by using a dummy circuit design on the wafer surface.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

FIGS. 3A–9A are top views of a number of regions of an integrated circuit device showing the metal circuitry in each of the regions.

FIG. 3B–9B correspond to FIGS. 3A–9A and show a top view of the regions of the chip having dummy circuitry added thereon to provide a uniform circuit density over the region.

DESCRIPTION OF THE PREFERRED EMBODIMENT(S)

Figure 1:
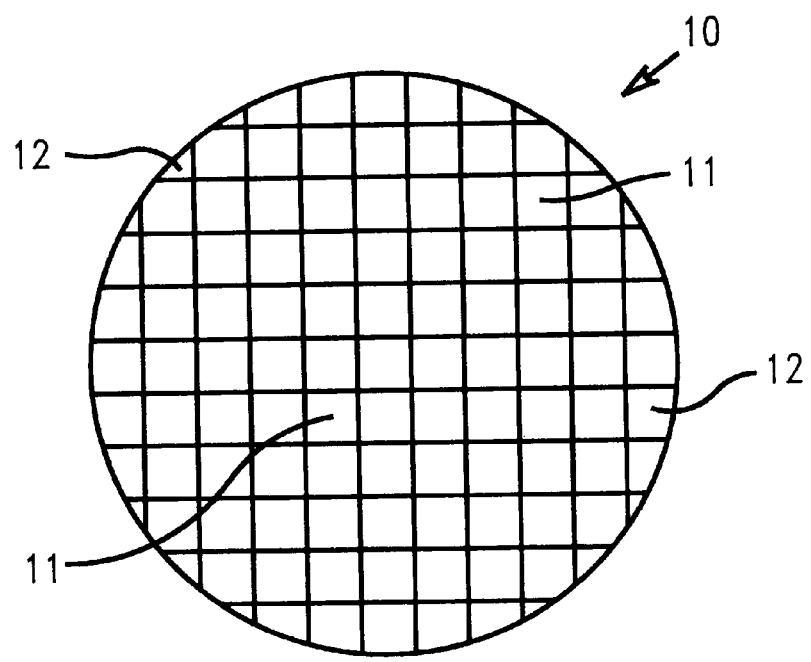
FIG. 1 is a top view of a wafer showing the wafer divided into a number of integrated circuit devices (chips).

In describing the preferred embodiments of the present invention, reference will be made herein to FIGS. 1–11D of the drawings in which like numerals refer to like features of the invention. Features of the invention are not necessarily shown to scale in the drawings.

Referring to the drawings, FIG. 1 shows a conventional wafer 10 which is divided into a number of discrete chips 11. At the periphery of the wafer 10 are a number of areas designated 12 which represent parts of the wafer on which circuitry is not formed and which are discarded after the wafer is fabricated and the wafer cut to form integrated circuit devices.

Figure 2:
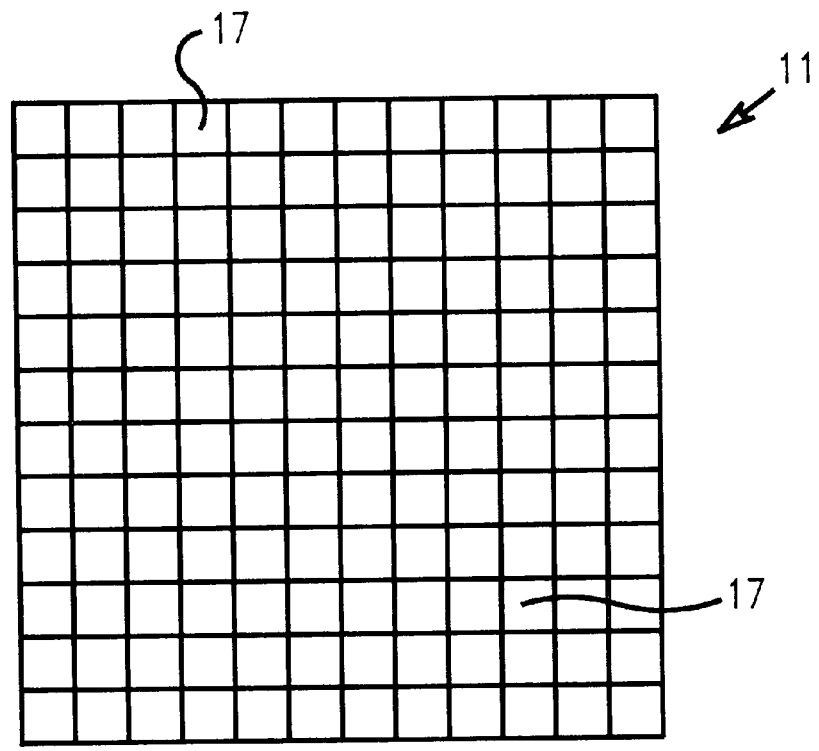
FIG. 2 is a top view of one of the chips of the wafer shown divided into a number of regions.

FIG. 2 is an enlarged view of a chip 11 on wafer 10. The chip 11 is divided into a number of regions 17 and each region typically has circuitry thereon. The number of regions 17 in which the chip 11 may be divided is not critical, but, in general, the larger the number of regions, the more uniform (planar) the wafer will be after the CMP process. Typically up to about 1,000 regions or more may be employed, e.g., 100–750. It is preferred that each region 17 be divided into a rectangular, preferably square shape as shown in FIG. 2. Typically, the wafer has about 50 chips thereon each up to about 1.5 inch×1.5 inch in size. The wafer is usually 8 inches in diameter.

Referring now to FIG. 3A–9A and 3B–9B, a number of regions 17 of a chip 11 are shown having different circuitry thereon. It will be assumed that a HPF and LPF limits have been set for each region and that dummy circuitry will be added as needed to at least reach the LPF limit. In FIG. 3A, region 17 has four lines 15 extending from one side of the region to the other side of the region. In FIG. 3B, dummy lines 20 have been added to the region 17 shown in FIG. 3A forming modified region 17A. Thus, it can be seen that the circuit density of region 17 of FIG. 3A has been increased. Also, preferably, the lines are added to provide a uniform circuit structure in region 17A. This may not always be possible, but was easily designed in this case because of the nature of the region 17 having only parallel metal lines 15.

In FIG. 4A, a region 17 is shown having a single line 15. To increase the circuit density of the region, additional dummy lines 20 have been added as shown in FIG. 4B to form region 17A. Likewise, in FIG. 5A, metal circuitry lines 15 are shown and, in FIG. 5B, dummy lines 20 have been added to form region 17A. In FIG. 6A, circuit lines 15 are shown in region 17 and dummy lines 20 have been added to region 17 as shown in FIG. 6B to form region 17A.

In FIG. 7A, a region 17 is shown having no circuitry. In FIG. 7B, six dummy lines 20 have been added to increase the circuit density of region 17 to form region 17A.

In FIG. 8A, a number of circuit lines 15 are shown in region 17. Since the circuit density of that region is at the upper limit of the HPF design pattern factor for the chip, no dummy lines have been added as shown for region 17A in FIG. 8B.

In FIG. 9A, transverse circuit lines 15 are shown in region 17. In FIG. 9B, a number of dummy lines 20 have been added to increase the circuit density of region 17 as shown in FIG. 9A to form region 17A.

Figure 11A:
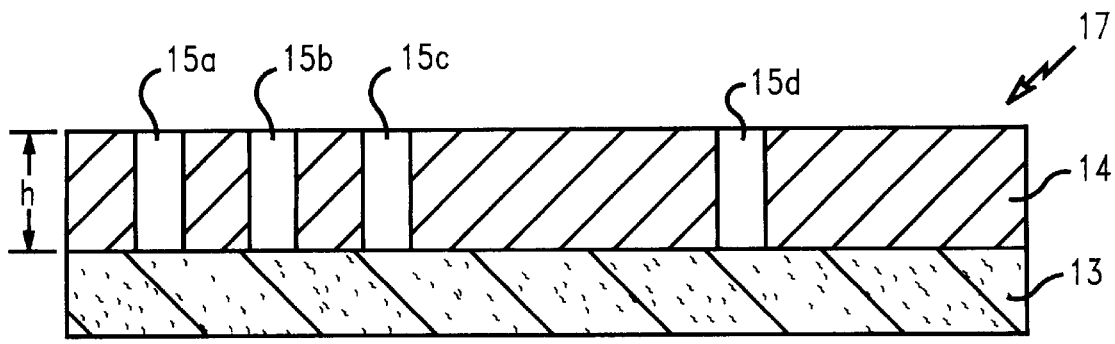
FIGS. 11A–11D show the method of the invention used to form a damascene level on a wafer.
Figure 11B:
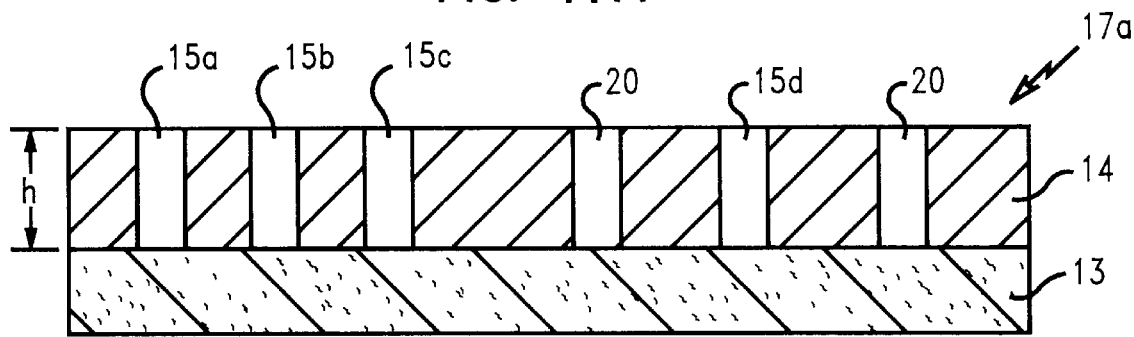
Figure 11C:
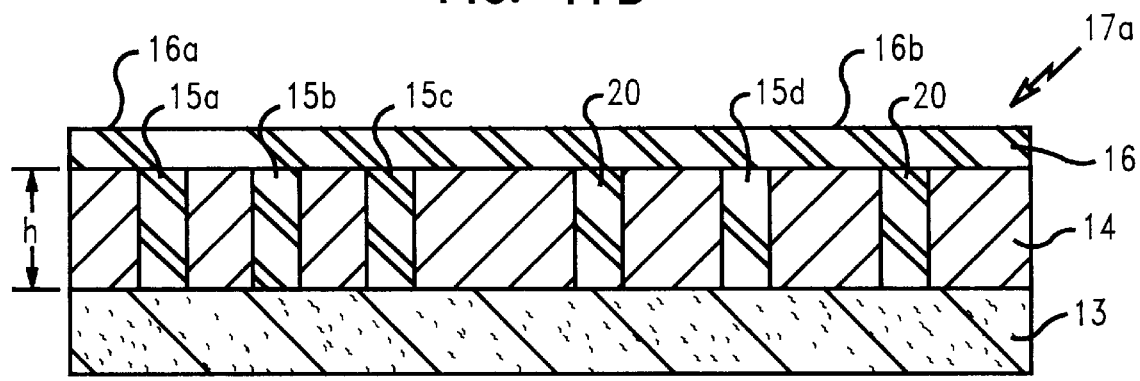

Referring now to FIGS. 11A–11D, the method of the invention of adding dummy metallization to a region of the chip is shown. In FIG. 11A, a silicon substrate 13 is shown having a silicon dioxide dielectric layer 14 thereon. In the dielectric layer 14 openings 15a, 15b, 15c and 15d are formed for interconnect openings and extend from the surface of layer 14 to the surface of silicon wafer 13. This configuration is similar to the configuration as shown in FIG. 3A. FIG. 11B shows the addition of dummy lines 20 which are the same as the addition of the dummy lines as shown in FIG. 3B. In FIG. 11C, a metal layer 16 is coated on top of dielectric layer 14 filling the openings 15a–15d and the dummy openings 20. The surfaces 16a and 16b of metal layer 16 at the opposed sides of region 17 are shown as being substantially horizontal (planar) indicating uniform metallization on the surface of region 17. The height of the openings in the dielectric layer 14 is shown as h. The metallized wafer of FIG. 11C is now chemical mechanically polished using conventional means to remove metal layer 16 down to the surface of dielectric 14. It can be seen that the remaining dielectric surface as indicated by opposed ends 14a and 14b is substantially horizontal over the region 17 of the chip.

Figure 10A:
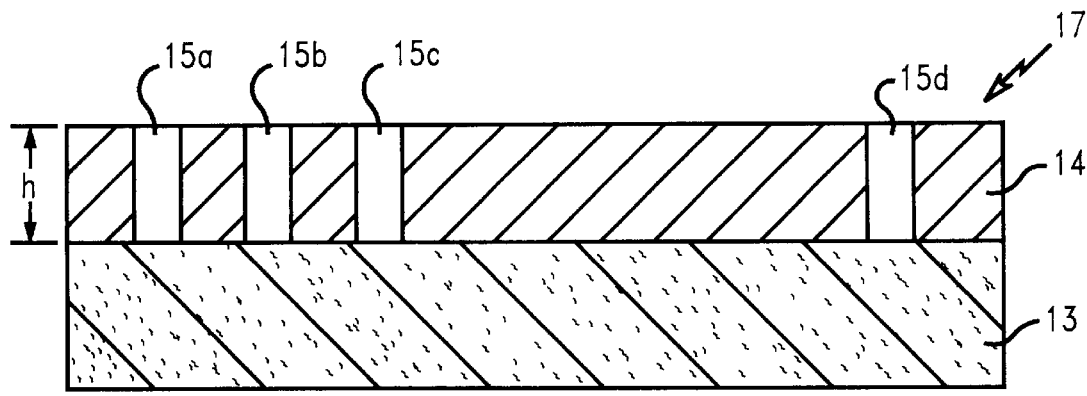
FIGS. 10A–10C show a series of steps of the prior art to form a damascene level on a wafer.
Figure 10B:
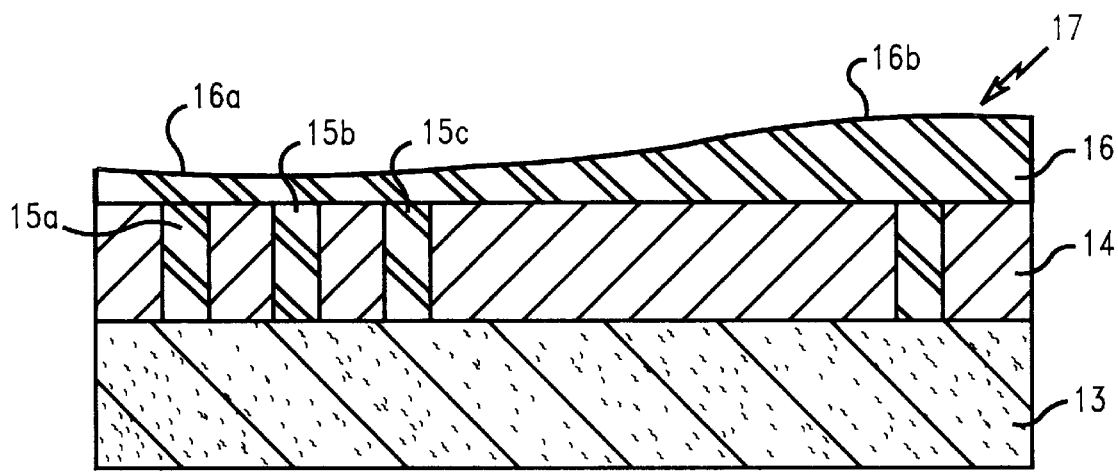
Figure 10C:
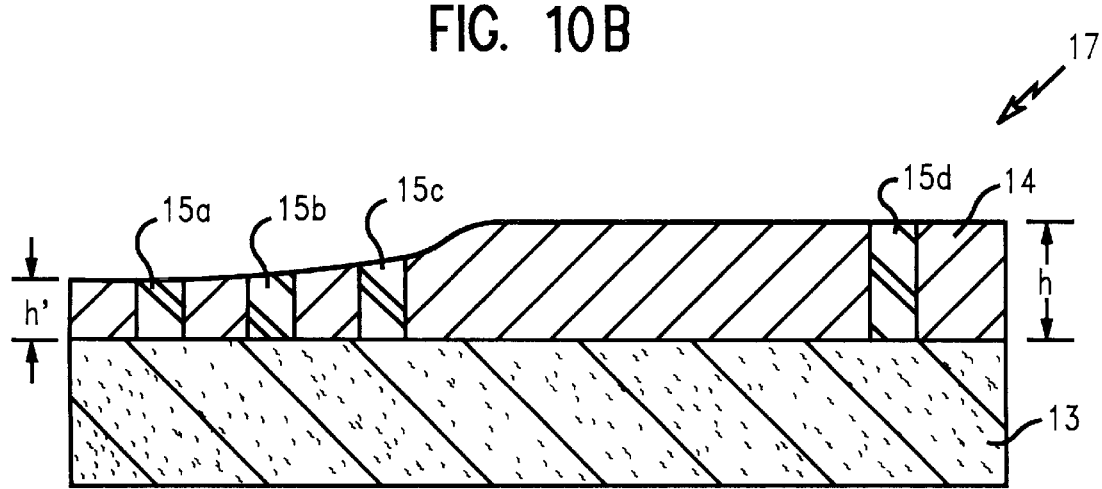

FIGS. 11A–11D showing the method of the invention using dummy circuitry to provide a uniform metallized dielectric surface is to be contrasted with FIGS. 10A–10C which show a method of planarization of a damascene layer of the prior art. Thus, in FIG. 10A, a region 17 of the chip has a silicon substrate 13 and a dielectric layer 14 thereon. Openings having a height h are provided in the dielectric and are identified as 15a–15d. In FIG. 10B, a metal layer 16 is deposited on the surface of dielectric layer 14 filling the openings 15a–15d and covering the complete surface of the dielectric. Because of the conservation of mass, the metal 16 deposited on dielectric surface 14 will be uneven (non-planar) having a lower height shown as 16a compared to a higher level 16b. The lower level 16a is over the high pattern factor area including openings 15a, 15b and 15c as compared to the higher level 16b which is over a lower pattern factor area including only opening 15d.

Figure 11D:
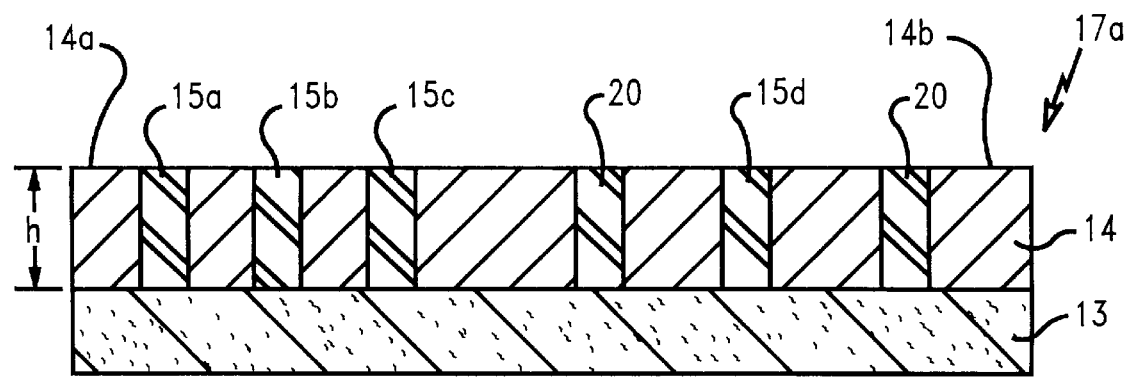

The wafer of FIG. 10B is then chemically-mechanically polished resulting in removal of metal layer 16 down to the openings in dielectric layer 14. As can be seen in FIG. 10C, the height h' of the high pattern factor area shown as having openings 15a, 15b and 15c is lower than the height h of the low pattern factor area which only has opening 15d therein. Accordingly, the region 17 is dished and does not have a horizontal topography as compared to the metallized and planarized region 17 made by the method of the invention as shown in FIG. 11D.

Referring back to FIG. 1, the peripheral areas of the wafer 12 which are not formed into chips are patterned with dummy circuitry as described hereinabove to provide a desired circuit density in the peripheral area 12. Providing a higher circuit density in those peripheral areas improves the overall planarization of the wafer and enhances the planarization of each chip on the wafer. As with the addition of dummy lines and circuitry to individual chips 11 as described hereinabove, the dummy circuitry will also be added to the peripheral areas 12 as indicated above. Thus, the peripheral areas 12 having no circuit density will be provided with at least a LPF circuit density and preferably a circuit density at about the mean of the LPF and HPF for the chips 11 on the wafer. The peripheral areas 12, as with the chips 11, will preferably be divided into zones 17 as shown in FIG. 2. Each zone of each peripheral area 12 will then be provided with dummy circuitry to enhance the overall planarization of the wafer 10.

The above description has been directed to silicon wafers and the use of a silicon dioxide as the dielectric. It will be appreciated by those skilled in the art that any wafer material and dielectric material may suitably be used in the method of the invention. Likewise, any metal may be used to metallize the damascene openings in the wafer surface with suitable metals including aluminum, copper, tungsten and the like. Typically, the thickness of the metal layer above the surface of the dielectric is about 0.5 to 1 microns.

To practice the method of the invention, any suitable CMP apparatus may be employed. Typically, the CMP apparatus utilizes a liquid slurry as is conventional in the art.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention, what is claimed is:

1. A method for planarizing damascene metallic circuit patterns of a plurality of discrete integrated circuit chips on a metal coated silicon wafer comprising the steps of:

dividing each chip on the wafer into a plurality of regions;

determining the metal density for each region of each chip based on the circuit pattern for that region;

adding a dummy circuit pattern to each region on each chip to provide at least a minimum metal density in each region or setting a maximum and/or minimum noted density for each region;

forming both the desired circuit pattern and any dummy circuit pattern as openings in a dielectric layer on each chip;

coating the patterned dielectric layer with a layer of metal which metal fills the openings forming the desired circuit pattern and any dummy circuit pattern and covers the surface of the wafer including the circuit patterns; and polishing the metal coated wafer until no metal remains outside the desired and any dummy circuit patterns.

2. The method of claim 1 wherein the maximum metal density is about 60–90%.

3. The method of claim 2 wherein the minimum metal density is about 20–50%.

4. The method of claim 1 wherein each chip is divided into up to about 1,000 regions.

5. The method of claim 4 wherein the regions are square.

6. The method of claim 1 wherein dummy circuit patterns or the setting of a maximum and/or minimum metal density are provided for chip fragments at the edge of the wafer.

* * * * *

UNITED STATES PATENT AND TRADEMARK OFFICE
CERTIFICATE OF CORRECTION

PATENT NO. : 6,093,631
DATED : July 25, 2000
INVENTOR(S) : Mark A. Jaso et al.

It is certified that error appears in the above-identified patent and that said Letters Patent is hereby corrected as shown below:

<u>Title page,</u>
Item [73], Assignee: add -- Siemens Aktiengesellschaft, Munich, Fed. Rep. Germany --

Signed and Sealed this

Eighteenth Day of June, 2002

Attest:

JAMES E. ROGAN
Attesting Officer          *Director of the United States Patent and Trademark Office*